(12) United States Patent
Hamilton

(10) Patent No.: US 9,093,582 B2
(45) Date of Patent: *Jul. 28, 2015

(54) SOLAR CANOPY ASSEMBLY

(71) Applicant: OpTerra Energy Services, Inc., Overland Park, KS (US)

(72) Inventor: Collin Hamilton, Brea, CA (US)

(73) Assignee: OPTERRA ENERGY SERVICES, INC., Overland Park, KS (US)

( * ) Notice: Subject to any disclaimer, the term of this patent is extended or adjusted under 35 U.S.C. 154(b) by 34 days.

This patent is subject to a terminal disclaimer.

(21) Appl. No.: 13/622,579

(22) Filed: Sep. 19, 2012

(65) Prior Publication Data

US 2014/0076377 A1    Mar. 20, 2014

(51) Int. Cl.
*H02N 6/00* (2006.01)
*H01L 31/042* (2014.01)
*H02S 30/20* (2014.01)

(52) U.S. Cl.
CPC ............ *H01L 31/0422* (2013.01); *H02S 20/00* (2013.01); *H02S 30/20* (2014.12); *Y02E 10/50* (2013.01)

(58) Field of Classification Search
CPC .................................................... H01L 31/045
USPC ........................................................ 136/245
See application file for complete search history.

(56) References Cited

U.S. PATENT DOCUMENTS

| | | |
|---|---|---|
| 816,719 A | 4/1906 | Fell |
| 1,284,565 A | 11/1918 | Bennett |
| 1,812,585 A | 6/1931 | Collins |
| 1,988,389 A | 1/1935 | Fitzhugh |
| 2,018,250 A | 10/1935 | Cohan |
| 2,098,752 A | 11/1937 | Miller |
| 2,654,147 A | 10/1953 | Wilson et al. |
| 2,971,736 A | 2/1961 | Ernst |
| 3,053,359 A | 9/1962 | Stanley |

(Continued)

FOREIGN PATENT DOCUMENTS

| | | |
|---|---|---|
| DE | 4129492 | 1/1993 |
| DE | 202010001742 | 5/2010 |

(Continued)

OTHER PUBLICATIONS

New Mexico State University, Eye on Research; Sun-News; NMSU to get solar-powered parking structure, Dec. 11, 2006, p. 6A, also found at: www.werc.net/News/Press%20Releases/IEE20StructureStory.pdf.

(Continued)

*Primary Examiner* — Eli Mekhlin
(74) *Attorney, Agent, or Firm* — Bryan Cave LLP

(57) ABSTRACT

A structure capable of folding into a compact form for transporting, and for simple unfolding for attachment to a base, the structure including: two or more hingably interconnected solar panel arrays each having a two or more of solar panels, a solar panel support channel, and a support beam; wherein the two or more solar panels are attached to top portions of the solar panel support channel, and a bottom portion of the solar panel support channel is attached to a top portion of the support beam, the support beam having a hinged joint for cooperating in folding into mutual, near coplanar juxtaposition; and where the structure, when unfolded includes a solar canopy and is T-shaped viewed on end.

2 Claims, 15 Drawing Sheets

(56) References Cited

U.S. PATENT DOCUMENTS

| | | | |
|---|---|---|---|
| 3,509,674 | A | 5/1970 | Birum |
| 3,557,439 | A | 1/1971 | Dykeman |
| 3,620,846 | A | 11/1971 | Paine et al. |
| 3,643,935 | A | 2/1972 | Bell |
| 3,741,405 | A | 6/1973 | McConnell et al. |
| 3,946,876 | A | 3/1976 | Jay |
| 3,969,863 | A | 7/1976 | Alderman |
| 4,015,653 | A | 4/1977 | Slysh et al. |
| 4,151,872 | A | 5/1979 | Slysh et al. |
| 4,184,476 | A | 1/1980 | McArthur |
| 4,206,748 | A | 6/1980 | Goodman et al. |
| 4,253,224 | A | 3/1981 | Hickman et al. |
| 4,255,910 | A | 3/1981 | Wendt |
| 4,262,809 | A | 4/1981 | McConnell |
| 4,315,163 | A | 2/1982 | Bienville |
| 4,393,859 | A | 7/1983 | Marossy et al. |
| 4,475,296 | A | 10/1984 | Fremstad |
| 4,481,774 | A | 11/1984 | Snook |
| 4,621,472 | A | 11/1986 | Kloke |
| 4,635,413 | A | 1/1987 | Hansen et al. |
| 4,659,072 | A | 4/1987 | De La Rosa |
| 4,909,869 | A | 3/1990 | Sakamoto et al. |
| 4,966,631 | A | 10/1990 | Matlin et al. |
| 5,125,608 | A | 6/1992 | McMaster et al. |
| 5,127,638 | A | 7/1992 | Kent |
| 5,210,685 | A | 5/1993 | Rosa |
| 5,233,931 | A | 8/1993 | McCorkle, Jr. |
| 5,355,575 | A | 10/1994 | Self |
| 5,433,259 | A | 7/1995 | Faludy |
| 5,460,660 | A | 10/1995 | Albright et al. |
| 5,487,471 | A | 1/1996 | Marchek et al. |
| 5,488,810 | A | 2/1996 | Horton |
| 5,499,480 | A | 3/1996 | Bass |
| 5,505,788 | A | 4/1996 | Dinwoodie |
| 5,524,401 | A | 6/1996 | Ishikawa et al. |
| 5,549,287 | A | 8/1996 | Loucks |
| 5,571,338 | A | 11/1996 | Kadonome et al. |
| 5,606,838 | A | 3/1997 | Hughes et al. |
| 5,716,155 | A | 2/1998 | Yoshida et al. |
| 5,741,370 | A | 4/1998 | Hanoka |
| 5,814,904 | A | 9/1998 | Galm |
| D408,554 | S | 4/1999 | Dinwoodie |
| 5,927,138 | A | 7/1999 | Richardson |
| 5,941,035 | A | 8/1999 | Purse |
| 6,058,601 | A | 5/2000 | DeKoning |
| 6,065,255 | A | 5/2000 | Stern et al. |
| 6,082,060 | A | 7/2000 | Bauer et al. |
| 6,155,017 | A | 12/2000 | Turner |
| 6,182,403 | B1 | 2/2001 | Mimura et al. |
| 6,308,489 | B1 | 10/2001 | Romes |
| 6,404,075 | B1 | 6/2002 | Potter et al. |
| 6,465,724 | B1 | 10/2002 | Garvison et al. |
| 6,470,632 | B1 | 10/2002 | Smith |
| 6,654,998 | B1 | 12/2003 | Berdan et al. |
| 6,672,018 | B2 | 1/2004 | Shingleton |
| 6,685,390 | B1 | 2/2004 | Eitzen |
| 6,722,357 | B2 | 4/2004 | Shingleton |
| 7,012,188 | B2 | 3/2006 | Erling |
| 7,102,074 | B2 | 9/2006 | Yen et al. |
| 7,171,793 | B2 | 2/2007 | Gordin et al. |
| 7,230,819 | B2 | 6/2007 | Muchow et al. |
| 7,237,360 | B2 | 7/2007 | Moncho et al. |
| 7,260,918 | B2 | 8/2007 | Liebendorfer |
| 7,487,771 | B1 | 2/2009 | Eiffert et al. |
| 7,531,741 | B1 | 5/2009 | Melton et al. |
| D595,645 | S | 7/2009 | Beghelli |
| 7,557,292 | B2 | 7/2009 | Shingleton et al. |
| 7,600,349 | B2 | 10/2009 | Liebendorfer |
| 7,607,628 | B2 | 10/2009 | Elder et al. |
| 7,743,575 | B2 | 6/2010 | Ito |
| 7,766,292 | B2 | 8/2010 | Liebendorfer |
| 7,774,998 | B2 | 8/2010 | Aschenbrenner |
| 7,807,918 | B2 | 10/2010 | Shingleton et al. |
| 7,810,489 | B2 | 10/2010 | Liu et al. |
| 7,814,899 | B1 | 10/2010 | Port |
| 7,856,769 | B2 | 12/2010 | Plaisted et al. |
| 8,240,109 | B2 | 8/2012 | Cusson et al. |
| 8,256,169 | B2 | 9/2012 | Cusson et al. |
| 8,316,590 | B2 | 11/2012 | Cusson |
| 8,430,372 | B2 | 4/2013 | Haddock |
| 8,453,986 | B2 | 6/2013 | Schnitzer |
| 8,479,459 | B2 | 7/2013 | Tucker |
| 8,584,338 | B2 | 11/2013 | Potter |
| 8,640,400 | B2 | 2/2014 | Liebendorfer |
| 8,657,991 | B2 | 2/2014 | Potter et al. |
| 8,813,440 | B2 | 8/2014 | Potter et al. |
| 8,839,500 | B2 | 9/2014 | Potter |
| 2002/0109411 | A1 | 8/2002 | Potter et al. |
| 2003/0070368 | A1 | 4/2003 | Shingleton |
| 2003/0070705 | A1 | 4/2003 | Hayden et al. |
| 2003/0101662 | A1 | 6/2003 | Ullman |
| 2003/0177706 | A1 | 9/2003 | Ullman |
| 2004/0011354 | A1 | 1/2004 | Erling |
| 2005/0109384 | A1 | 5/2005 | Shingleton et al. |
| 2006/0096635 | A1 | 5/2006 | Tuttle |
| 2006/0171086 | A1 | 8/2006 | Hennessy et al. |
| 2006/0219547 | A1 | 10/2006 | Tuttle |
| 2006/0276938 | A1 | 12/2006 | Miller |
| 2007/0246039 | A1 | 10/2007 | Brazier et al. |
| 2008/0029148 | A1 | 2/2008 | Thompson |
| 2008/0230047 | A1 | 9/2008 | Shugar et al. |
| 2008/0236571 | A1 | 10/2008 | Keshner |
| 2009/0050194 | A1 | 2/2009 | Noble et al. |
| 2009/0140576 | A1 | 6/2009 | Yu et al. |
| 2009/0205703 | A1 | 8/2009 | Umotoy et al. |
| 2009/0223142 | A1 | 9/2009 | Shingleton et al. |
| 2009/0229200 | A1 | 9/2009 | Noble et al. |
| 2009/0230265 | A1 | 9/2009 | Newman et al. |
| 2009/0282755 | A1 | 11/2009 | Abbott et al. |
| 2009/0314327 | A1 | 12/2009 | Saha et al. |
| 2010/0031586 | A1 | 2/2010 | Miller |
| 2010/0073220 | A1 | 3/2010 | Olesen et al. |
| 2010/0077592 | A1 | 4/2010 | Casano |
| 2010/0083954 | A1 | 4/2010 | Bartelt-Muszynski |
| 2010/0108118 | A1 | 5/2010 | Luch |
| 2010/0108120 | A1* | 5/2010 | Lin et al. ............ 136/245 |
| 2010/0132768 | A1 | 6/2010 | Ito et al. |
| 2010/0132769 | A1 | 6/2010 | Potter et al. |
| 2010/0163015 | A1 | 7/2010 | Potter et al. |
| 2010/0179704 | A1 | 7/2010 | Ozog |
| 2010/0193260 | A1 | 8/2010 | Freeman |
| 2010/0212722 | A1 | 8/2010 | Wares |
| 2010/0236183 | A1 | 9/2010 | Cusson et al. |
| 2010/0237029 | A1 | 9/2010 | Cusson et al. |
| 2010/0254813 | A1 | 10/2010 | Dawson et al. |
| 2010/0313939 | A1 | 12/2010 | Krein et al. |
| 2010/0317141 | A1 | 12/2010 | Krein et al. |
| 2011/0005573 | A1* | 1/2011 | Chang et al. ............ 136/245 |
| 2011/0047931 | A1 | 3/2011 | Wallgren |
| 2011/0058664 | A1 | 3/2011 | Prax et al. |
| 2011/0072740 | A1 | 3/2011 | Dieter et al. |
| 2011/0094088 | A1* | 4/2011 | Potter et al. ............ 29/592.1 |
| 2011/0094559 | A1 | 4/2011 | Potter et al. |
| 2011/0113714 | A1 | 5/2011 | Hsu et al. |
| 2011/0138599 | A1 | 6/2011 | Bellacicco et al. |
| 2011/0198304 | A1 | 8/2011 | Wallgren |
| 2011/0240093 | A1 | 10/2011 | Tucker |
| 2011/0283923 | A1 | 11/2011 | Potter |
| 2011/0284709 | A1 | 11/2011 | Potter |
| 2012/0027550 | A1 | 2/2012 | Bellacicco et al. |
| 2012/0198696 | A1 | 8/2012 | Potter et al. |
| 2012/0229077 | A1 | 9/2012 | Tsuchiya |
| 2013/0082637 | A1* | 4/2013 | Eaton et al. ............ 320/101 |
| 2013/0122639 | A1 | 5/2013 | Degroot et al. |
| 2014/0076377 | A1 | 3/2014 | Hamilton |
| 2014/0076378 | A1 | 3/2014 | Hamilton |
| 2014/0076383 | A1 | 3/2014 | Potter |
| 2014/0077055 | A1 | 3/2014 | Hamilton |
| 2014/0163754 | A1 | 6/2014 | Potter et al. |
| 2014/0163755 | A1 | 6/2014 | Potter et al. |
| 2014/0163756 | A1 | 6/2014 | Potter |
| 2014/0175251 | A1 | 6/2014 | Potter |

(56) References Cited

U.S. PATENT DOCUMENTS

FOREIGN PATENT DOCUMENTS

| DE | 102009033946 | | 1/2011 |
| DE | 102009040091 | | 3/2011 |
| DE | 202011005048 | | 10/2011 |
| DE | 102012202465 | | 8/2012 |
| EP | 1683728 | | 7/2006 |
| EP | 1947019 | | 7/2008 |
| EP | 2469238 | | 6/2012 |
| EP | 2509180 | | 10/2012 |
| WO | 2006053128 | | 5/2006 |
| WO | 2008058284 | | 5/2008 |
| WO | WO 2008088311 | A2 * | 7/2008 |
| WO | 2014092821 | | 6/2014 |
| WO | 2014092822 | | 6/2014 |
| WO | 2014092823 | | 6/2014 |

OTHER PUBLICATIONS

Sundial Energy, Inc., ShartShade Solar Parking Structures, preinted Jan. 21, 2010, pp. 1-3, also found at www.sundialenergy.com/su_css_pages/product_shade.html.

David Nagel, Campus Technology, UCSD Plants Solar Trees on Parking Structures, Sep. 9, 2008, pp. 1-3, also found at www.campustechnology.com/Articles/2008/09/UCSD-Plants-Solar-Trees_on_Parking_Structures.aspx.

Justin, for Metaeficient.com, Solar Canopies for Parking Lots, printed Jan. 21, 2010, pp. 1-9, also found at www.metawfficient.com/renewable-power/solar-canopies-for-parking-lots.html.

MBcarc Constructions Inc., Potovoltaic Canopies, Approved Drawing, by California Division of State Architect, Aug. 19, 2009.

Ruey-Hsun Liang et al., A fuzzy-optimization approach for generation scheduling with wind and solar energy systems, IEEE Service Center, 22(4): 1665-1674.

Connecting the Sun—Solar Photovoltaic on the Road to Large-Scale Grid Integration, EPIA, Sep. 12.

Patent Cooperation Treaty, International Search Report for PCT/US2013/057273, dated Mar. 5, 2014, 4 pages.

Patent Cooperation Treaty, International Search Report for PCT/US2013/057273, dated Jan. 7, 2014, 4 pages.

Patent Cooperation Treaty, International Search Report for PCT/US2013/057267, dated Dec. 5, 2013, 3 pages.

Patent Cooperation Treaty, International Search Report for PCT/US2001/001767, dated Apr. 26, 2001, 1 page.

* cited by examiner

*Photovoltaic Shade Structure System*
100

Manufacture and preassemble constituent elements of Photovoltaic Shade Structure System — 110

Attach shipping brackets, fold, collapse, and prepare Photovoltaic Shade Structure System for transport to destination site — 120

Load Photovoltaic Shade Structure System onto transport vehicle for delivery to installation site — 130

140 Installation site prepared? — no → Prepare installation site (Fig. 2) — 150 yes ↓

Mount Photovoltaic Shade Structure System to prepared installation site structure — 160

Unfold and Remove shipping brackets — 170

Connect electrical wiring between Photovoltaic Shade Structure System and site electrical connection — 180

Done — 190

FIG. 1

Site Preparation for Photovoltaic Shade Structure System
200

Grade earth and bore footing holes
210

Prepare footing and underground electrical
220

Pour footings to ensure the alignment between the concrete footing and the Photovoltaic Shade System
230

FIG. 2

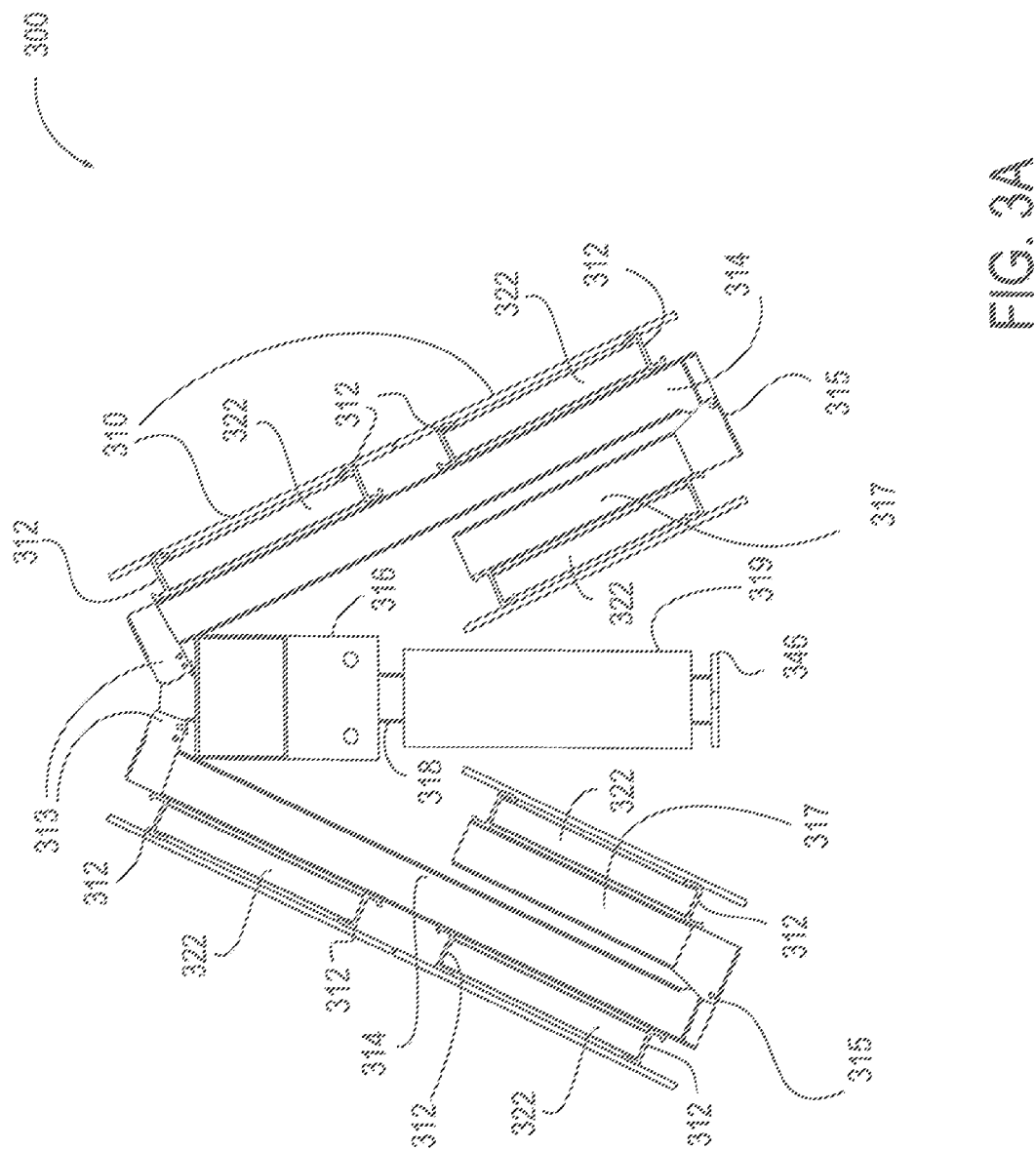

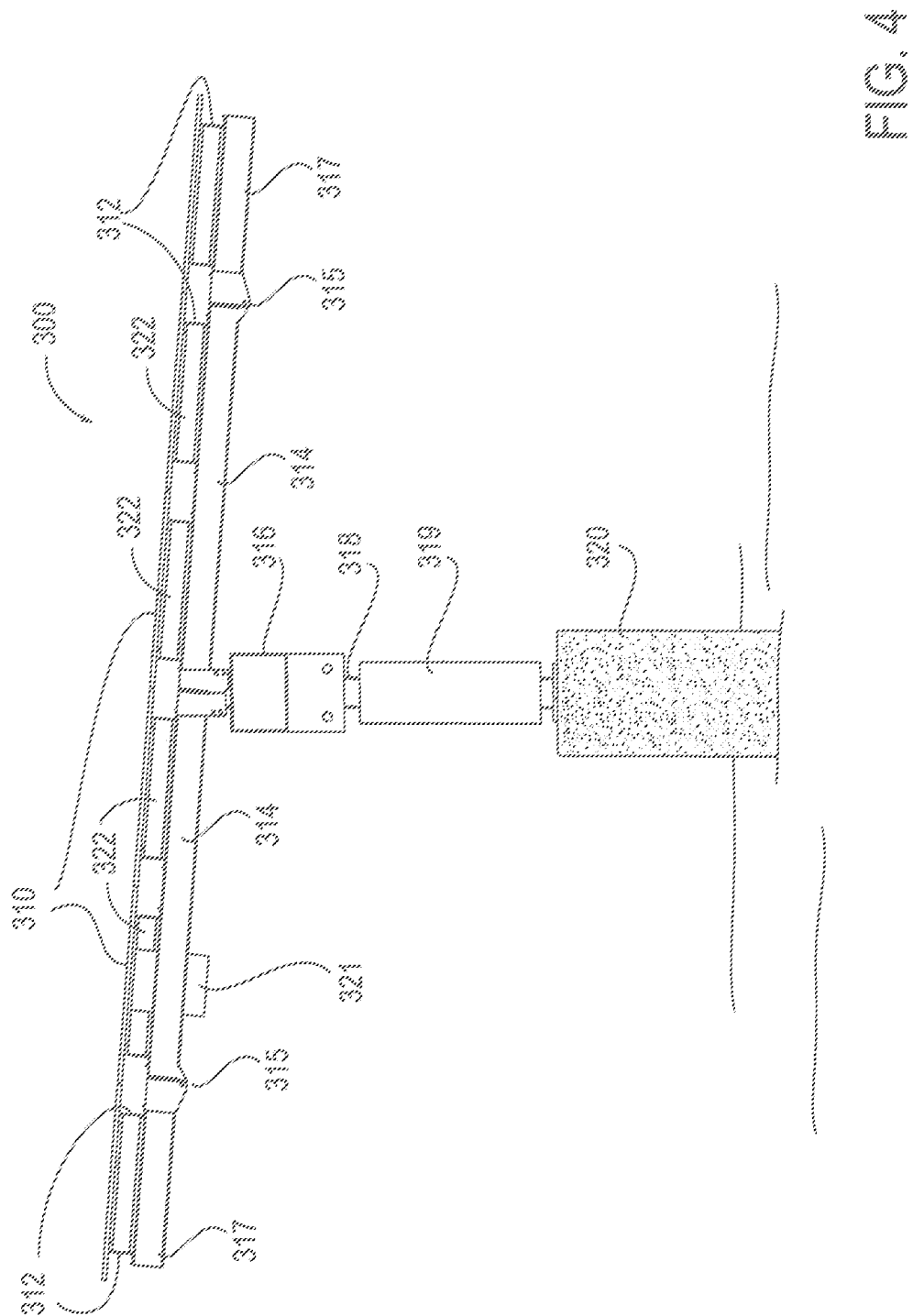

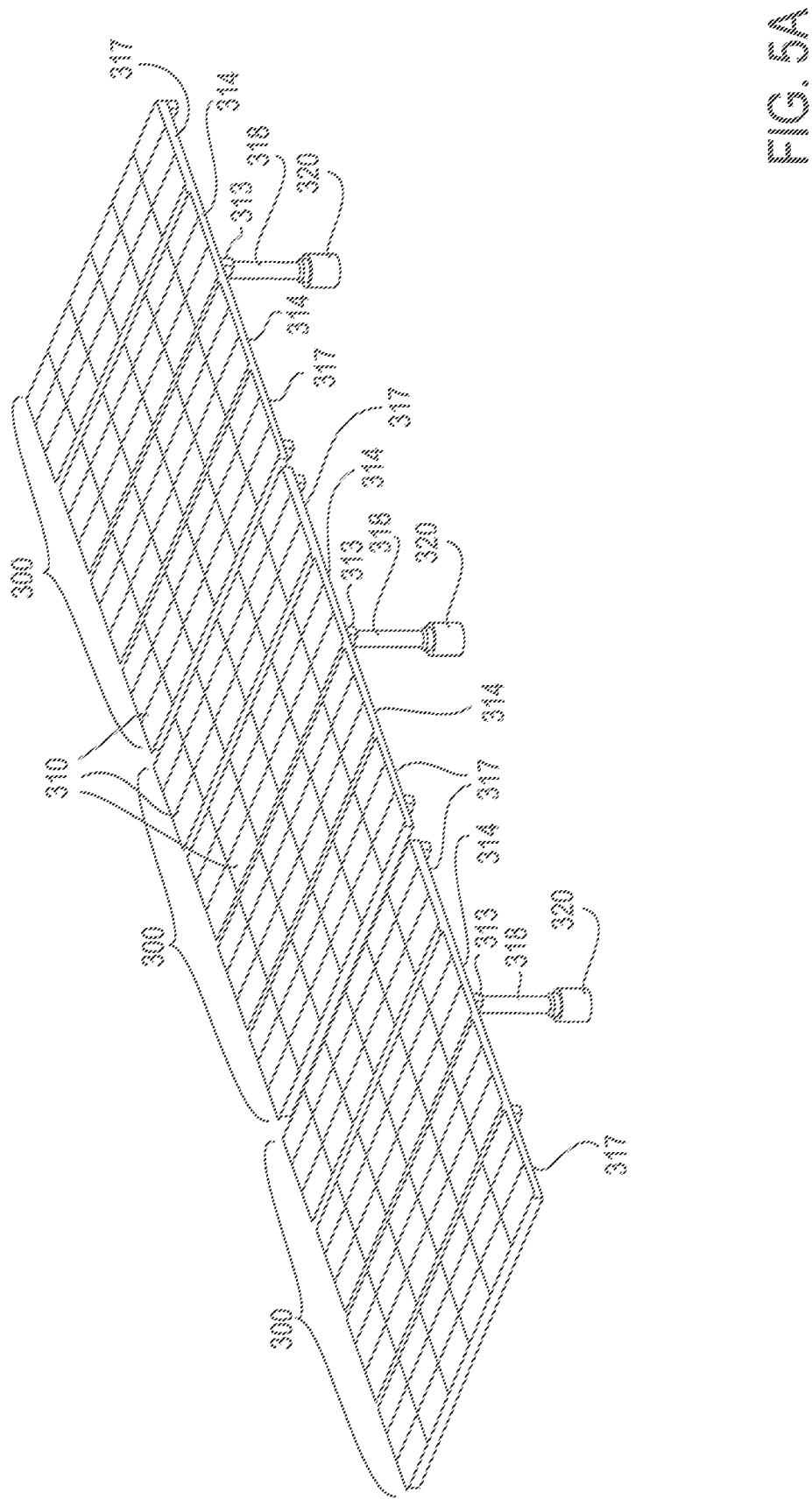

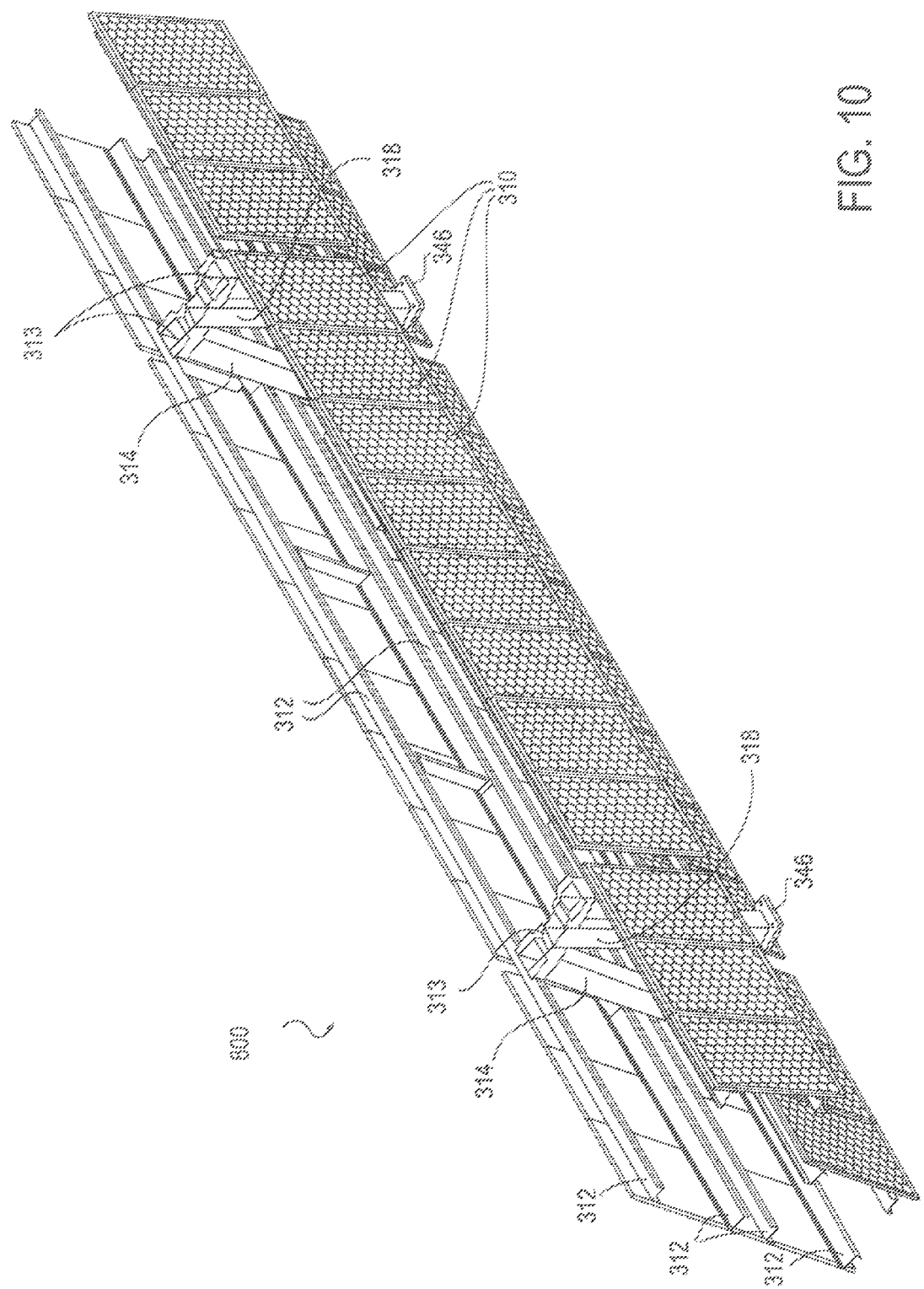

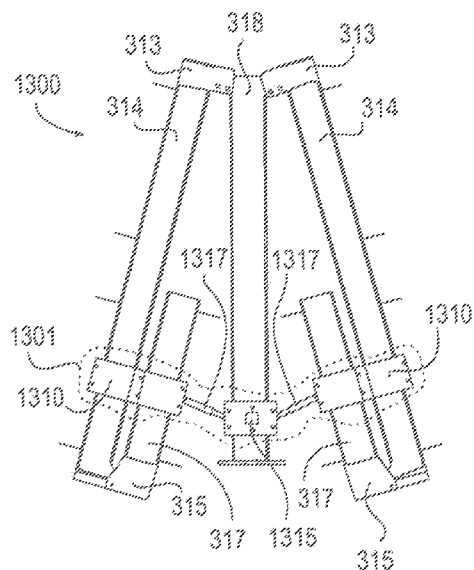
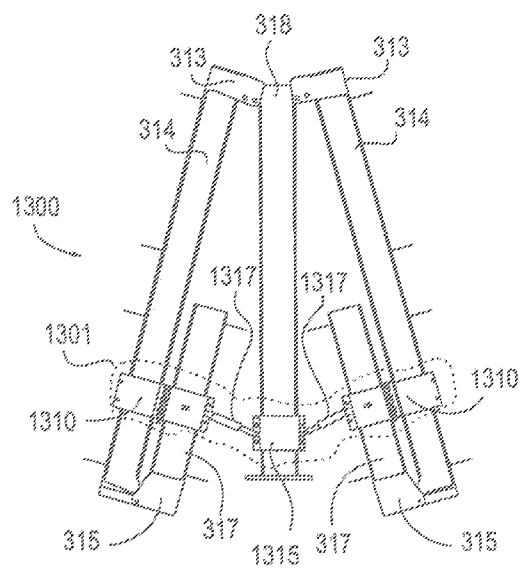
FIG. 11A                    FIG. 11B
FIG. 12

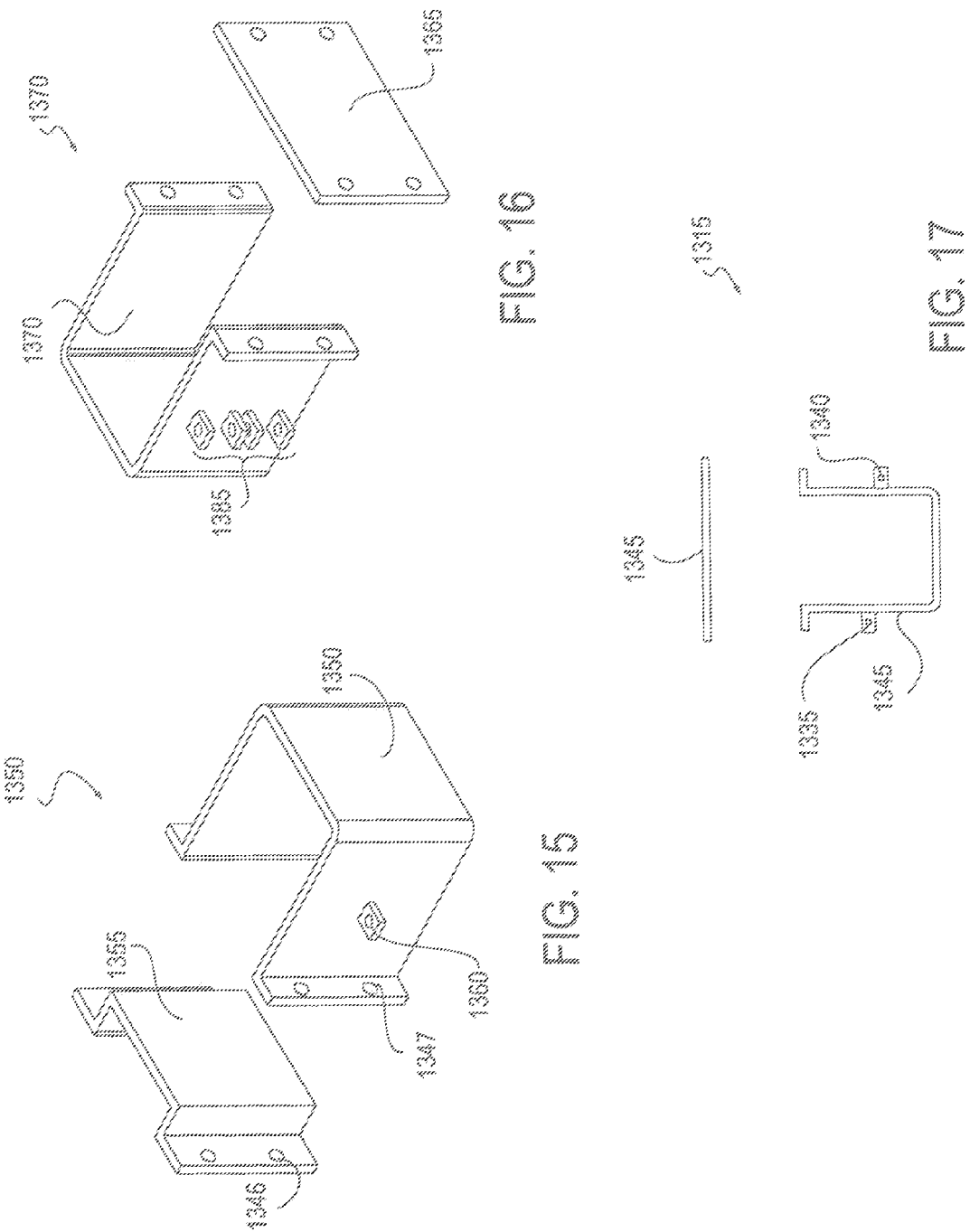

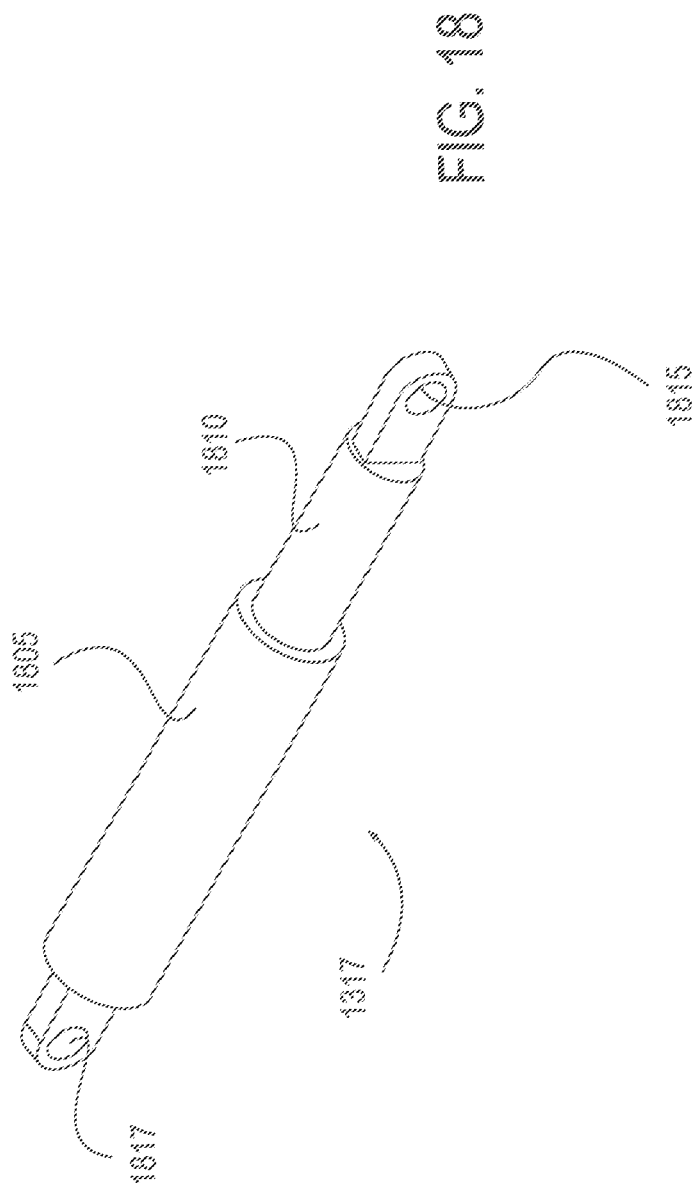

SOLAR CANOPY ASSEMBLY

COPYRIGHT NOTICE AND AUTHORIZATION

This patent document contains material which is subject to copyright protection.

© Copyright 2012. Chevron Energy Solutions Company, a division of Chevron U.S.A. Inc. All rights reserved.

With respect to this material which is subject to copyright protection. The owner, Chevron Energy Solutions has no objection to the facsimile reproduction by any one of the patent disclosure, as it appears in the Patent and Trademark Office patent files or records of any country, but otherwise reserves all rights whatsoever.

FIELD OF THE INVENTION

This invention relates to system and method for a foldable solar canopy.

BACKGROUND OF THE INVENTION

Solar energy is a clean, renewal energy source. Photo-electro voltaic cell technology is increasing rapidly and makes installation of solar collector panels housing the photo-electro voltaic cells more and more economically feasible. Beyond the photo-electro voltaic cell technology itself are the problems of placement and support of the solar collector panels. Large numbers of solar collector panels must be assembled in series to achieve useful power production. In remote areas these may be placed on the ground without interfering with land use. In more developed areas, it is desirable to place the solar collector panels such that the land may also be used for other purposes, e.g., for parking lots, school/office hallways, playgrounds, or sports fields. To achieve this requires an elevated structure to support the solar collector panels.

Prior known systems for elevated structures for supporting the solar collector panels are inefficient and overly expensive since they require excessive amounts of materials, particularly steel support elements, and on-site construction. Also, known systems take an excessive amount of time to install.

It is desirable to have a method and system which overcomes the deficiencies of known systems. The instant invention provides such a solution.

SUMMARY OF THE INVENTION

The invention includes a solar canopy a structure capable of folding into a compact form for transporting, and for simple unfolding for attachment to a base. The structure comprises a plurality of hingably interconnected solar panel arrays each having a plurality of solar panels, a solar panel support channel, and a support beam; wherein the plurality of solar panels is attached to top portions of the solar panel support channel, and a bottom portion of the solar panel support channel is attached to a top portion of the support beam, the support beam having a hinged joint for cooperating in folding into mutual, near coplanar juxtaposition; and whereby the structure, when unfolded comprises a solar canopy and is T-shaped viewed on end.

In another embodiment, the invention includes a solar canopy a solar canopy structure capable of folding into a compact form for transporting, and for simple unfolding for attachment to a foundation, the structure comprising one or more support beams for supporting a plurality of solar panel support channels and a plurality of solar panels, the support beams having an integral hinge for cooperating in folding into a compact form for transporting.

These and other features and advantages of the present invention will be made more apparent through a consideration of the following detailed description of a preferred embodiment of the invention. In the course of this description, frequent reference will be made to the attached drawings.

BRIEF DESCRIPTION OF THE DRAWINGS

FIG. 1 is one embodiment of a flow chart for the process of manufacturing, transporting, and installing the foldable solar canopy structure of the invention.

FIG. 2 is one embodiment of a flow chart for the process of preparing the site prior to installing the foldable solar canopy structure of the invention.

FIG. 3A is a side view of one embodiment of the foldable solar canopy structure of the invention when folded.

FIG. 4 is a side view of one embodiment of the foldable solar canopy structure of the invention unfolded and installed.

FIG. 5A is a perspective view of one embodiment of multiple foldable solar canopy structures of the invention unfolded.

FIG. 10 is an isometric view of an L-shaped embodiment of the foldable solar canopy structure of the invention folded.

FIG. 11A is an inside elevation view of another embodiment of a portion of the folded foldable solar canopy structure and bracing of the invention.

FIG. 11B is an outside elevation view of another embodiment of a portion of the folded foldable solar canopy structure and bracing of the invention folded.

FIG. 12 is a side elevation view of another embodiment of a portion of the folded foldable solar canopy structure and bracing of the invention.

FIG. 15 is an isometric/exploded view of another embodiment of the bracing of the invention.

FIG. 16 is an isometric/exploded view of another embodiment of the bracing of the invention.

FIG. 17 is a top/exploded view of another embodiment of the bracing of the invention.

FIG. 18 is a top/exploded view of another embodiment of a bracing element of the invention.

DETAILED DESCRIPTION OF PREFERRED EMBODIMENTS

Figure 3B:
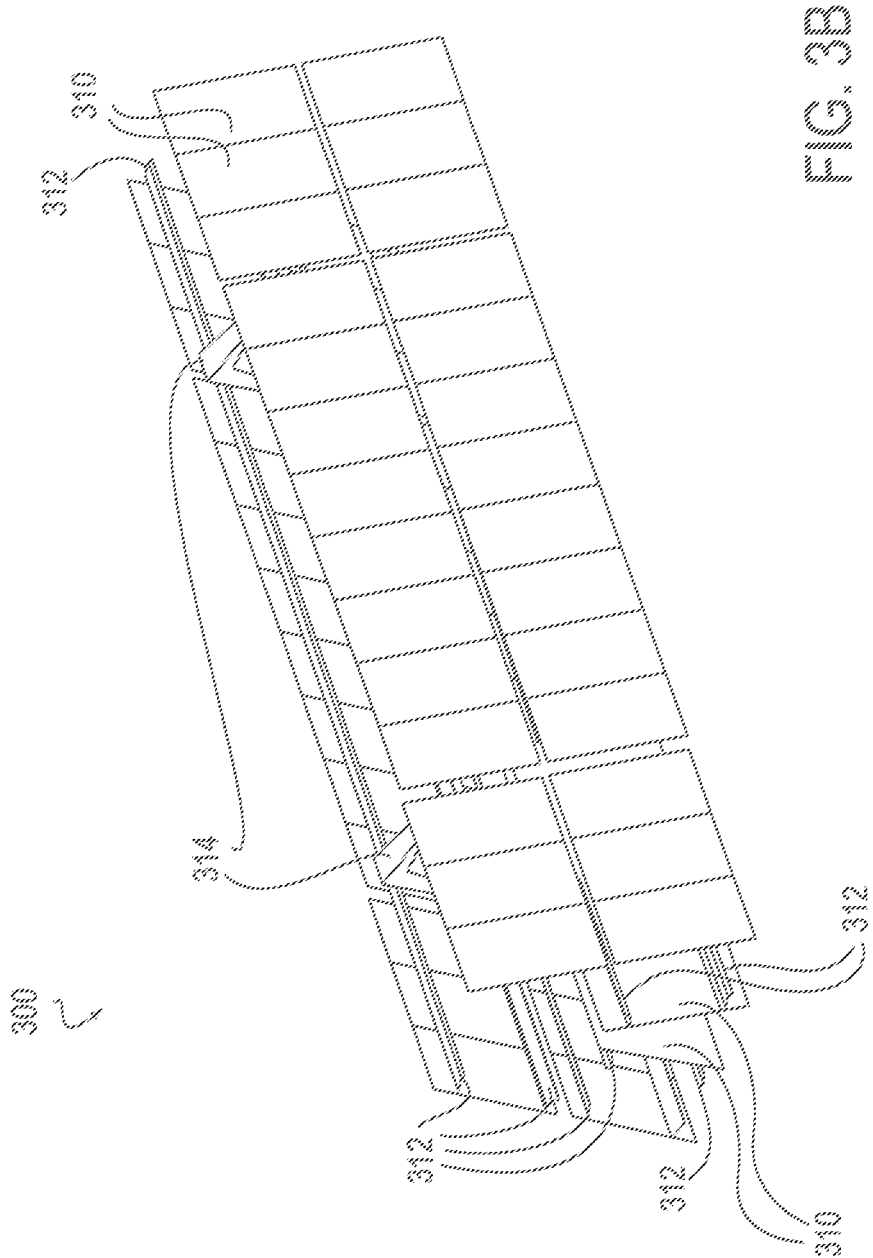
FIG. 3B is a perspective view of one embodiment of the foldable solar canopy structure of the invention when folded.

Field labor prices are expensive. By designing a folding structure so it can be shipped, a majority of the field labor is moved into the factory. This allows for lower labor costs going into the installation of Photovoltaic Solar Shade Structures. A known method of partially addressing this problem is by manufacturing portions of the structures in the factory, then shipping those portions out in parts, and assembling them in the field. The Manufactured Folding Photovoltaic Shade Structure of the invention allows for more components to be connected, wired, tested and even commissioned in the factory before being sent to the site for installation.

The invention includes a one or two or multiple column photovoltaic shade structure which is fully assembled in a factory. This assembly in some embodiments includes electrical panels, inverters, combiner boxes, lights, conduit, AC panel board or DC combiner, pull boxes, wire management components, strut, conduit, monitoring equipment and any other components which will be on the structure in the field. The assembled units are fully tested and partially commissioned in the factory before being shipped to the site for installation. In one embodiment, the largest manufactured shade structures would be up to approximately 40-50 feet plus long and weigh less than approximately 20,000 lbs.

Once there is a fully assembled Shade Structure of the invention in the factory it needs to be transported to the site. This design of the invention will allow the units to be folded up while remaining wired, placed on a truck and shipped to the site. In one embodiment, specially designed shipping bracing is used to allow the Shade Structure to be folded up for shipping without damaging the equipment.

In one embodiment, a horizontal beam for supporting channels and solar panels is "broken" (or articulated) in 3 locations; one in the center at the column and beam connection point. The other two broken locations are outward from the center/column and before the two outer ends of the beam. In one embodiment the outer broken locations are between the outer most solar panel and the adjacent solar panel. Hinges or other pivotable structures are part of or attached to the broken portions of the beam. In one embodiment the hinges are built into the plate steel and use bolts or steel rods as the hinge point. When the Manufactured Folding Photovoltaic Shade Structure of the invention is installed on site, each side of the structure is raised, one at a time, the bolt holes will be lined up and the bolts can be installed. If bolts are used for the hinge point, the bolts are also tightened down.

In one embodiment, as the units are being unfolded the shipping, installation and transportation bracing is removed in the same order it was installed. The bracing can also be adjusted on site to ensure footing and Manufactured Folding Photovoltaic Shade Structure column alignment.

Benefits of the invention include predictable/repeatable results, reduced financial risk, accuracy in scheduling, and accuracy in pricing. The benefits also include cost savings, leveraged scale to reduce cost, lower labor rates, manufacturing improvements in efficiency, enhanced procurement processes, refined and predictable pricing, controlled fabrication environment, and facilitates various design and construction tools.

These and other features and advantages of the present invention will be made more apparent through a consideration of the following detailed description of a preferred embodiment of the invention. In the course of this description, frequent reference will be made to the attached drawings.

FIG. 1 is one embodiment 100 of a flow chart for the process of manufacturing, transporting, and installing the foldable solar canopy structure of the invention. First in assembly step 110 the foldable solar canopy structure (also referenced as the Folding Photovoltaic Shade Structure) is manufactured by pre-assembling the separate components. Then in folding step 120, cross-braces 322 (see, e.g., FIG. 3A) are attached. The structure is folded and collapsed to prepare for transport to the installation site. In the loading step 130 the foldable solar canopy structure is loaded onto a transport vehicle (e.g., flat bed truck, barge, flat bed train car) for transport to the installation site. If the installation site is not prepared 140, then the site is prepared 150. If it is prepared the foldable solar canopy structure is mounted 160 on the prepared site, i.e., mount columns on prepared bases. In unfolding step 170, the structure is unfolded and locked in position and any shipping brackets are removed. Then in wiring step 180, the electrical wiring is connected between the foldable solar canopy structure and any site electrical connection for distribution or storage of solar-produced electrical energy. This concludes 190 the method of constructing, transporting, and installing the foldable solar canopy structure.

FIG. 2 is one embodiment of a flow chart for the process of preparing the site prior to installing the foldable solar canopy structure 300 (FIG. 3A). The site for installation of the foldable solar canopy structure is prepared by a first grading and boring step 210 to level the ground as needed and bore holes for insertion of footing material, e.g., reinforced concrete, metal beam or column, or other now known or future developed footing materials. In another embodiment no footing holes are prepared and instead, e.g., a column or beam is forced into the ground. Any underground electrical infrastructure and other footing preparations are then done 220. In the embodiment where the footing material is concrete, the concrete is then poured into the prepared footing holes, together with and reinforcement bars 230. Care must be taken to place the footings for alignment with the foldable solar canopy structure. In one embodiment using concrete footings with embedded footing bolts protruding out of the top of the set concrete, brackets or templates should be used to insure proper placement of the footing bolts.

FIG. 3A is a side view of one embodiment of the foldable solar canopy structure 300 when folded. Beam support columns 318 are for attaching at the base to a footing (not shown). The beam support columns 318 are removably attached to, e.g., reinforced concrete bollards by bolting the beam support columns 318 to the reinforced concrete bollards via bolts embedded in the concrete of the bollards and flanges 346 integral with the beam support columns 318.

Foldable Zee channel support beams have a first section 314 for hingably attachment at an inner end (relative to the center of the structure) to the top of the beam support columns 318 via hinge flange 313. In one embodiment, the support beams are made of tube steel. An outer end of first section 314 hingably connects to a second section 317 of the Foldable Zee channel support beams via hinge flange 315. The first section 314 in one embodiment has sufficient length for at least two solar panels 310 side-by-side. The second section 317 in one embodiment has sufficient length for at least one solar panel 310. For each solar panel 310 on each of the first section 314 and second section 317, there are at least two Zee channels 312 attached with an axis substantially perpendicular to the axis of at least two Zee channel support beams sections 314 and 317. While the support beams are referred to as "Zee channel" support beams, the types of channels or other support between the support beams and the solar panels may include any other known or future developed materials, e.g., C-channels or other suitable materials.

Each Zee channel 312 is of sufficient length to span two Zee channel support beams, 314 (first section) and 317 (second section), where the channel support first and second sections, 314 and 317, are parallel and in line and set at a sufficient distance apart to accommodate a plurality of solar panels 310 end-to-end or side-by-side supported by the Zee channels 312, which are supported by the channel support beams, first and second sections, 314 and 317, which are supported by the beam support columns 318, one beam support column 318 per each set of two channel support beams, first and second sections, 314 and 317. In one embodiment, each set of adjacent Zee channels 312 is disposed in a reverse orientation to each adjacent Zee channel 312.

FIG. 3B is a perspective view of one embodiment of the foldable solar canopy structure 300 when folded.

FIG. 4 is a side view of one embodiment of the foldable solar canopy structure of the invention unfolded and installed. The channel support beams first and second sections, 314 and 317, in one embodiment are a single beam with three or four hingable, foldable, pivotable, or collapsible sections. Alternately, the channel support beams first and second sections, 314 and 317, are two beams, each having two sections, first/inner section and second/outer section 314 and 317, respectively. In each case the sections are pivotably or hingably connected such that the beam(s) can either be folded or unfolded. The folded state is used during transportation from the manufacturing site to the installation site. The unfolded state is for the final operating configuration after installation. The hingable/pivotable connections within or between the channel support beams 314 and 317 are any known or future developed means providing for folding or unfolding and locking in the unfolded position with sufficient structural integrity for the intended load and any desired safety margin. The hingable/pivotable connections are in one embodiment integral to the beams and in another embodiment a separate hinge component fixably attached to the beam.

In one embodiment the inner/first sections 314 will have integral or attached hinges on both ends, one for hingable connection to a top portion of the beam support column 318 and one for hingable connection to the inner end of the outer section 317. In that embodiment the outer section 317 has a hingable connection only at its inner end for hingable connection to the outer end of inner/first section 314. Other configurations are within the scope of the invention, e.g., 3-4 sections rather than 2 sections channel support beams first and second sections 314 and 317. In the folded state the height and width of the foldable solar canopy structure 300 is sufficient for transportation on the intended mode of transportation, e.g., barge, truck, or train car. Braces 322 are added as needed and optionally only during transportation, e.g., to maintain the folded state or to provide increased strength of the solar panels 310 to the Zee channels 312 to account for the sheer force that would not be present in the final unfolded state. In this embodiment, when unfolded, the two channel support beams first and second sections 314 and 317, one on each side of the beam support column 318, form in effect a single beam aligned on the same axis and connected end-to-end. Ancillary electrical equipment (shown in other figures, e.g., FIG. 3A), e.g., weather station 321, inverter 316, AC panel board 319 can be attached beneath the canopy, e.g., attached to a part of the beam support columns 318 or channel support beams first and second sections 314 or 317.

FIG. 5A is a perspective view of one embodiment of a plurality of the foldable solar canopy structures 300 aligned end-to-end and unfolded and installed and attached to bollard/footing 320. Any number, e.g., 10, 20, 50, of foldable solar canopy structures 300 may be aligned end-to-end to achieve the desired electric energy generation and to fit the available space at the site. Typically, the plurality of foldable solar canopy structures 300 are electrically connected in series. In this embodiment the bollard/footing 320 is above grade. In another embodiment the top of the bollard/footing is at grade. Ancillary electrical equipment, e.g., a D.C.-A.C. inverter is attached beneath the canopy, e.g., attached to a part of channel support beams first and second sections 314 or 317.

Figure 5B:
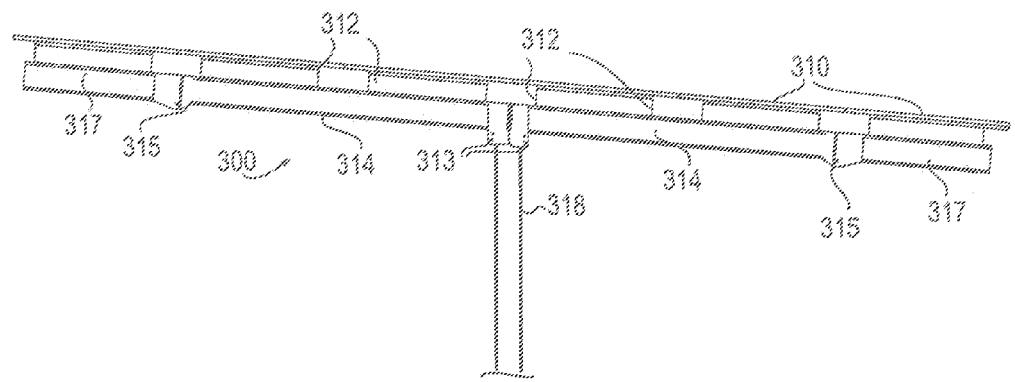
FIG. 5B is a side elevation view of one embodiment of the foldable solar canopy structure of the invention unfolded and installed.

FIG. 5B is a side elevation view of one embodiment of the foldable solar canopy structure of the invention unfolded and installed. Beam support column 318 supports the rest of the structure. Hinge flanges 313 are attached to or integral with the top end of beam support column 318. A foldable Zee channel support beam first and second sections (314, 317) is attached to a hinge flange 313. In one embodiment, the foldable Zee channel support beams are comprised of a first section 314 proximate to the beam support column 318 and a second section 317. The first and second sections are connected via hinge 315 which is integral to or attached to the first and section sections (314 and 317). The end of the first section proximate to the beam support column 318 is connected to or integral with the hinges/hinge flanges 313. The hinge flanges 313 and 315 permit the foldable Zee channel support beams to fold downwards towards the ground. In folded/collapsed position the foldable solar canopy structure 300 has a much smaller "footprint" or width making it a suitable size for transport via truck, barge, or train.

Zee channels 312 are fixedly attached at perpendicular angles to the foldable Zee channel support beams at their upper side. A plurality of solar panels 310 are fixedly attached to the upper portions of the Zee channels 312. In one embodiment each solar panel 310 is attached such that its lengthwise axis is perpendicular to the lengthwise axis of the Zee channels 312. In one embodiment the solar panels 310 are spaced on the Zee channels 312 so as to be within a few inches or less of one another other on each side so as to maximize solar panel area for each structure. In one embodiment gaps are left between the solar panels over the channel support beams sufficient to permit attachment of braces (not shown) and for attachment of "toe" line or other line or cable for use in unfolding/expanding the foldable solar canopy structure 300 at the installation site. The hinge flanges 315 and 313 release and lock using any conventional devices such as pins or bolts (not shown) which slide into place to prevent articulation of the hinge. Other mechanisms are latches connecting the 2 parts of the hinge. Other mechanisms are clasps, overlapping lips, interacting groves, and other known or future developed mechanisms.

Figure 6:
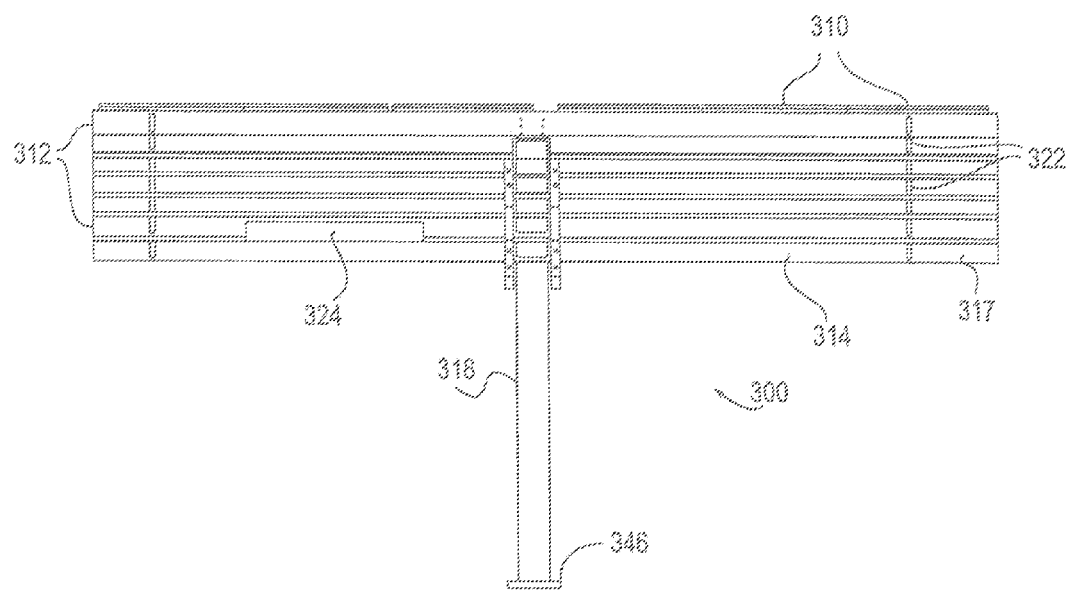
FIG. 6 is a front elevation view of one embodiment of the foldable solar canopy structure of the invention unfolded.

FIG. 6 is a front elevation view of one embodiment of the foldable solar canopy structure of the invention unfolded and installed. It shows the plurality of Zee channels 312 supporting a plurality of solar panels 310.

Figure 7:
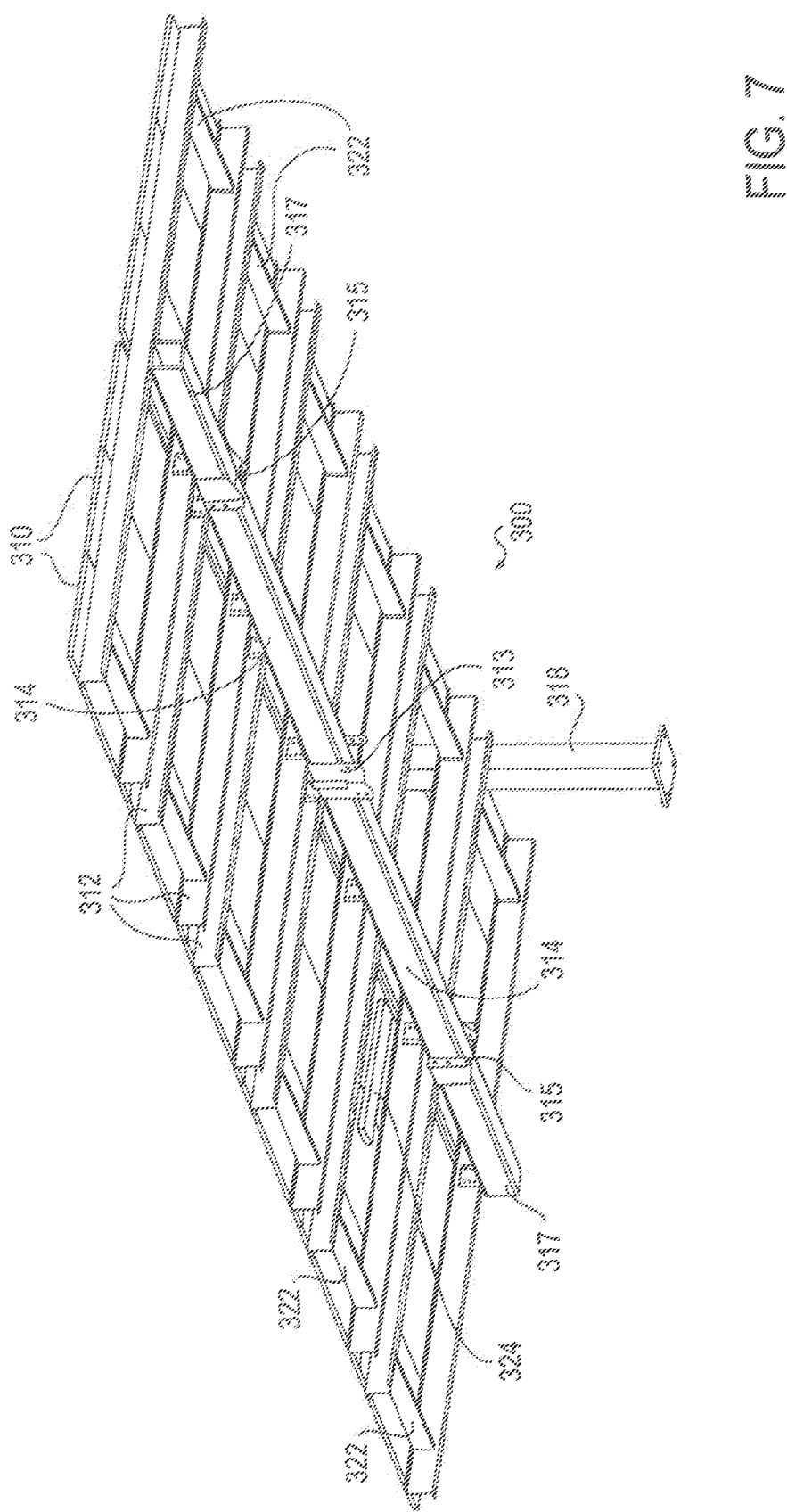
FIG. 7 is an isometric view of one embodiment of the foldable solar canopy structure of the invention unfolded.

FIG. 7 is an isometric view of one embodiment of the foldable solar canopy structure of the invention unfolded and installed. In addition to the other elements of the structure, it shows the cross-brace 322 which in one embodiment connects in multiple locations between adjacent Zee channels 312 for structural stability. Light 324 is also depicted. Other components or accessories may also be attached under the expanded foldable solar canopy structure 300, e.g., electrical boxes 319, inverters 316, or other control or measurement equipment 321.

Figure 8:
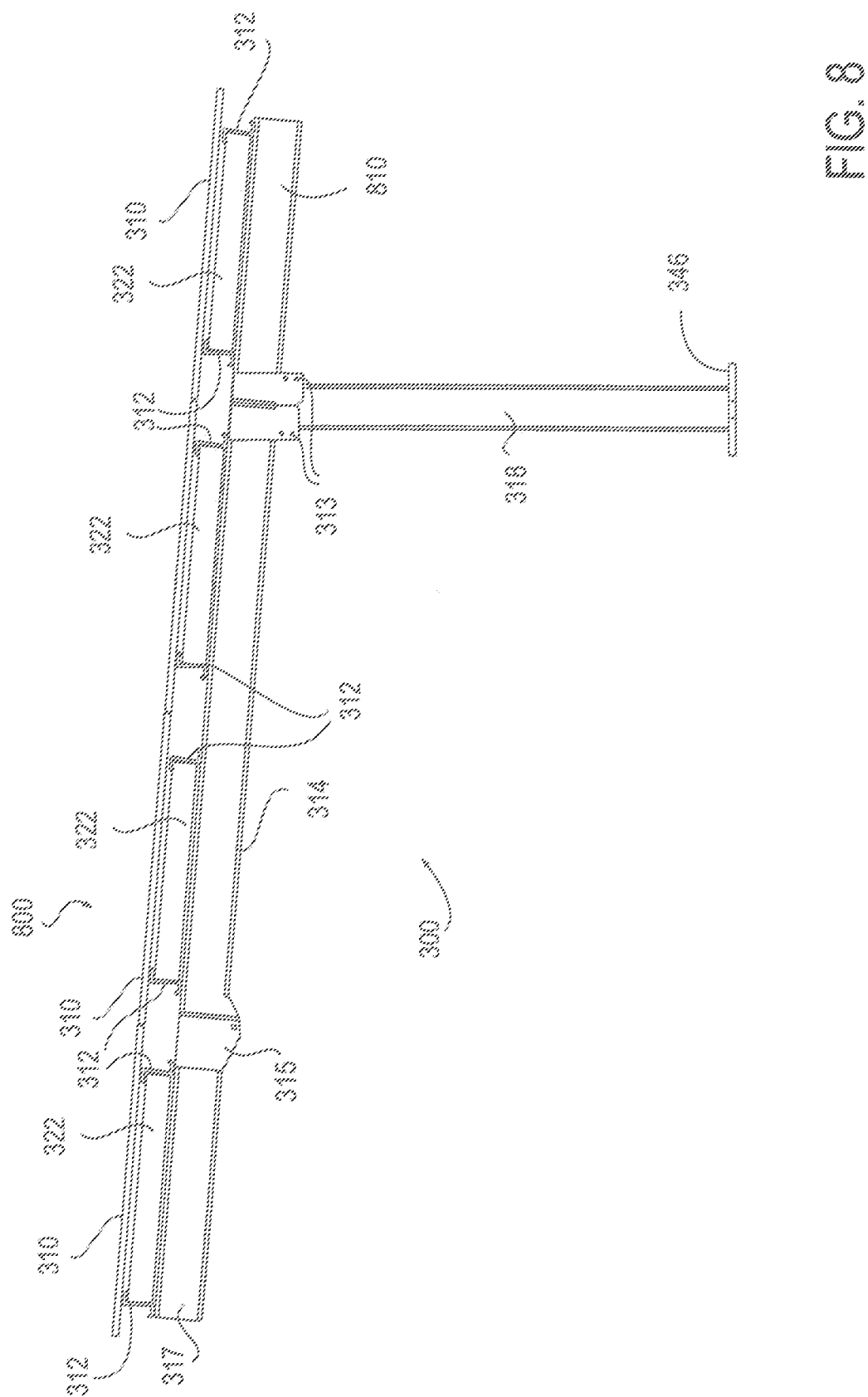
FIG. 8 is a side elevation view of an L-shaped embodiment of the foldable solar canopy structure of the invention unfolded.

FIG. 8 is a side elevation view of an L-shaped embodiment of the foldable solar canopy structure 800 of the invention unfolded and installed. Beam support columns 318 are for attaching at the base to a footing (not shown). The beam support columns 318 are removably attached to, e.g., reinforced concrete bollards (not shown) by bolting the beam support columns 318 to the reinforced concrete bollards via bolts (not shown) embedded in the concrete of the bollards and flanges 346 integral with the beam support columns 318.

One of the foldable Zee channel support beams first and second sections (314 and 317) have a first section 314 for hingably attachment at an inner end (relative to the center of the structure) on one side at the top of the beam support columns 318 via hinge flange 313. In one embodiment, the support beams are made of tube steel. An outer end of first section 314 hingably connects to a second section 317 of the Foldable Zee channel support beams via hinge flange 315. The first section 314 in one embodiment has sufficient length for at least two solar panels 310 side-by-side. The second section 317 in one embodiment has sufficient length for at least one solar panel 310. The opposing foldable Zee channel support beam (810) has only one section, having a first end attached to hinge flange 313 and an opposite end not attached.

For each solar panel 310 on each of the first section 314 and second section 317 of one foldable Zee channel support beams first and second sections (314 and 317) and the other foldable Zee channel support beam (810), there are at least two Zee channels 312 attached with an axis substantially perpendicular to the axis at least two Zee channel support beams sections, 314 and 317, and 810. While the support beams are referred to as "Zee channel" support beams, the types of channels or other support between the support beams and the solar panels may include any other known or future developed materials, e.g., C-channels or other suitable materials.

Each Zee channel 312 is of sufficient length to so that it spans two Zee channel support beams first and second sections 314 and 317, and 810, where the channel support beams first and second sections 314 and 317, and 810 are parallel and in line and set at a sufficient distance apart to accommodate a plurality of solar panels 310 end-to-end or side-by-side supported by the Zee channels 312, which are supported by the channel support beams first and second sections 314 and 317, and 810, which are supported by the beam support columns 318, one beam support column 318 per each set of two channel support beams first section and second section 314 and 317. In one embodiment, each set of adjacent Zee channels 312 is disposed in a reverse orientation to each adjacent Zee channel 312. In an alternate embodiment there is only a Zee channel support beam on one side of beam support column 318.

Figure 9:
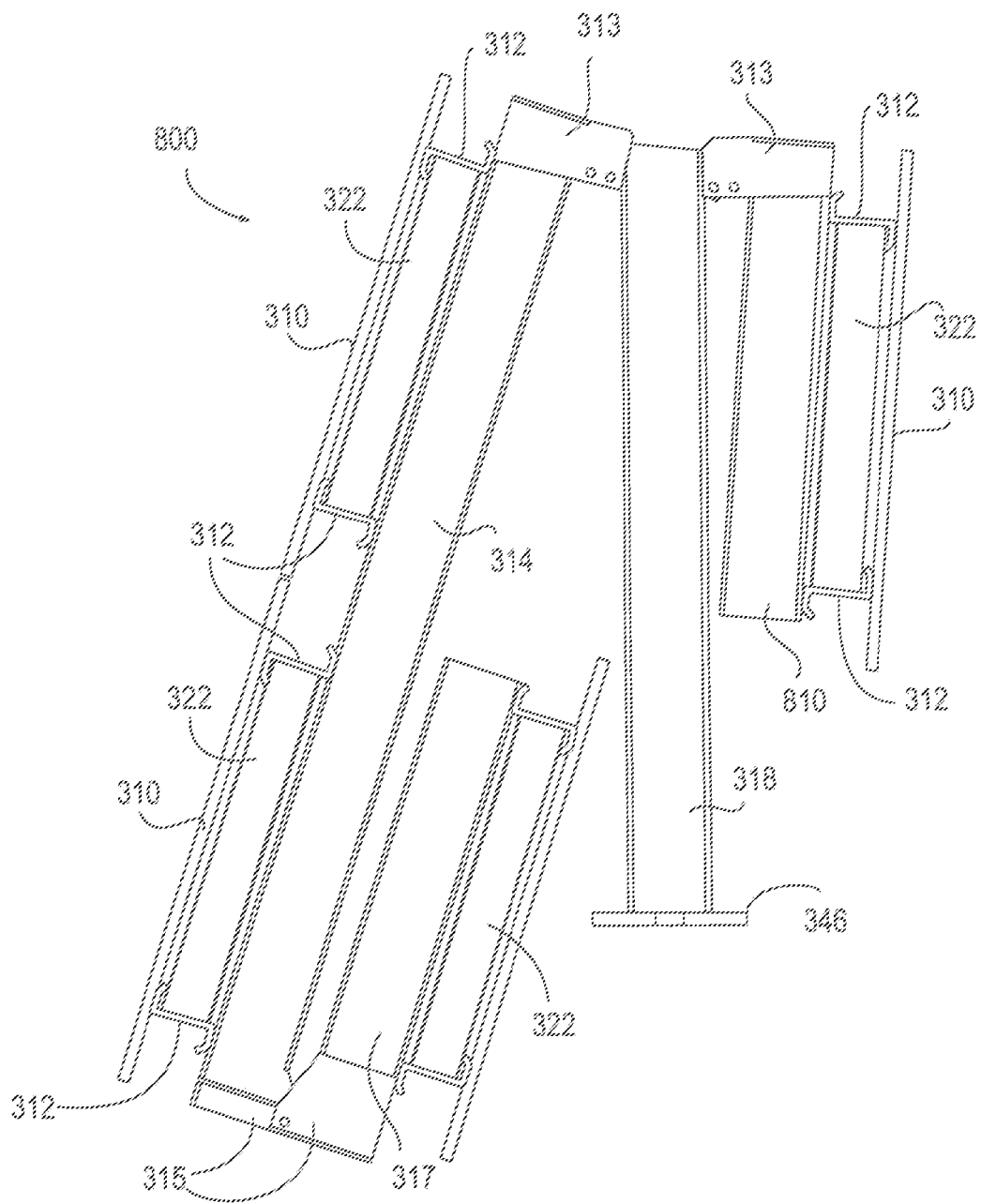
FIG. 9 is a side elevation view of an L-shaped embodiment of the foldable solar canopy structure of the invention folded.

FIG. 9 is a side elevation view of an L-shaped embodiment of the foldable solar canopy structure 800 of the invention folded. Since one of the channel support beams first and second sections 314 and 317 is longer than the other 810, the former channel support beams extend farther down in the folded position.

FIG. 10 is an isometric view of an L-shaped embodiment of the foldable solar canopy structure of the invention folded.

FIG. 11A is an inside elevation view of another embodiment of a portion of the folded foldable solar canopy structure and bracing of the invention 1300. In this figure the solar panels 310 are omitted for clarity. The description of FIG. 3A above is incorporated herein by reference in its entirety. Brace assembly 1301 is removably attached to beam support column 318 and to each of the channel support beams first and second sections 314 and 317. The brace assembly 1301 is for stabilizing the solar canopy structure 1300 during transport. Brace assembly 1301 is comprised of a first and second brace clamp, here shown as single element 1310, for removable attachment to each of the channel support beams first and second sections 314 and 317, a third brace clamp 1315 for removable attachment to beam support column 318, and a shock absorber 1317 for attaching the third brace clamp to each first and second brace clamp 1310. In another embodiment shock absorber 1317 is replaced with a fixed length strut. FIG. 11B is an outside elevation view of another embodiment of a portion of the folded foldable solar canopy structure and bracing of the invention 1300 shown in FIG. 11A.

Further detail of the brace assembly will be provided in other figures. The bracing assembly 1301 is suitable for use with a folded foldable solar canopy structure 1300 having either a single or multiple beam support columns 318. In one embodiment there is one bracing assembly 1301 for each beam support column 318. FIGS. 11A and 11B show opposing views of a single beam support column 318.

FIG. 12 is a side elevation view of another embodiment of a portion of the folded foldable solar canopy structure and bracing of the invention 1300 folded. This embodiment has two beam support columns 318. In addition to the other bracing elements (not all shown) discussed in FIGS. 13-17, this embodiment depicts an additional brace component, the support bar 1325. Support bar 1325 attaches at ends to the third brace clamp 1315 attached to each beam support column 318. In one embodiment support bar 1325 is a fixed length and in another embodiment it has a variable/adjustable length. In addition to overall stability, support bar 1325 joins the bottom portion of the two beam support columns 318 for maintaining a fixed spacing between the beam support columns, i.e., typically substantially equal at the top and bottom of the columns, so that the columns are substantially vertical. This facilitates installation at the site, i.e., where a foundation is prepared with bolts positioned for attachment of columns 318.

Figure 13:
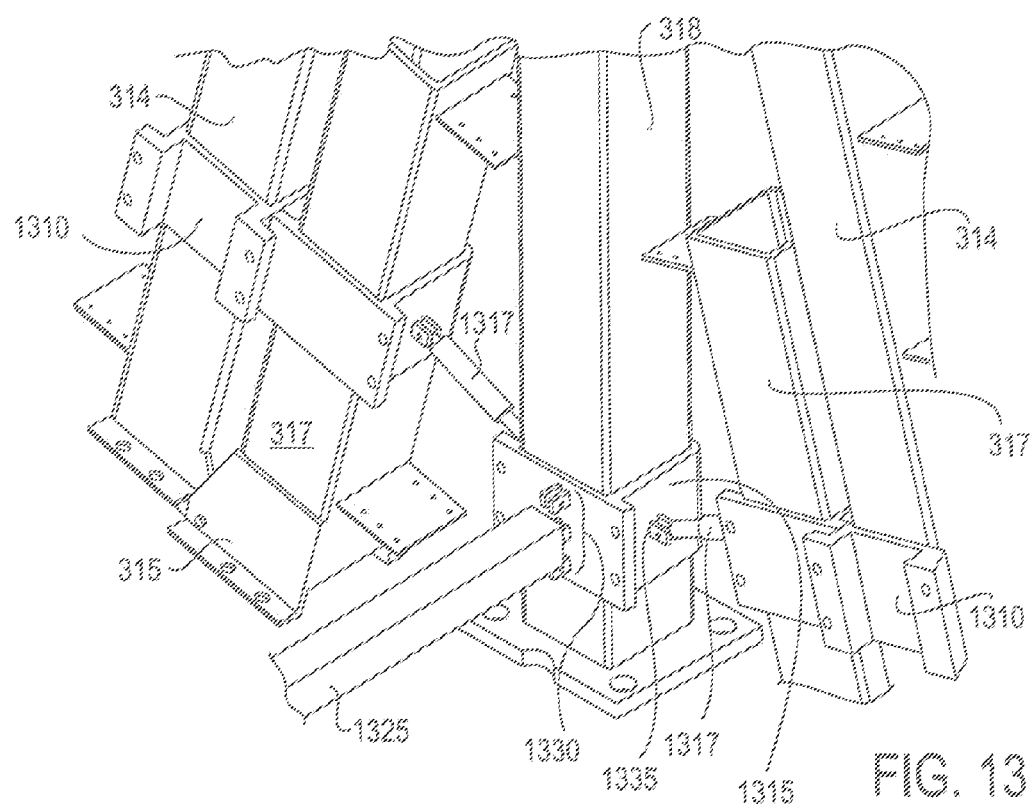
FIG. 13 is an isometric view of another embodiment of a portion of the folded foldable solar canopy structure and bracing of the invention folded.

FIG. 13 is an isometric view of another embodiment of a portion of the folded foldable solar canopy structure and bracing of the invention in the folded position. First and second brace clamps (jointly referenced here as 1310) attach to each of the channel support beams first and second sections 314 and 317 and to each other. The third brace clamp 1315 attaches to beam support column 318, and a strut/shock 1317 attaches to third brace clamp 1315 to each first and second brace clamp 1310. Third brace clamp 1315 has connection flanges 1330 for attachment to support bar 1325.

Figure 14:
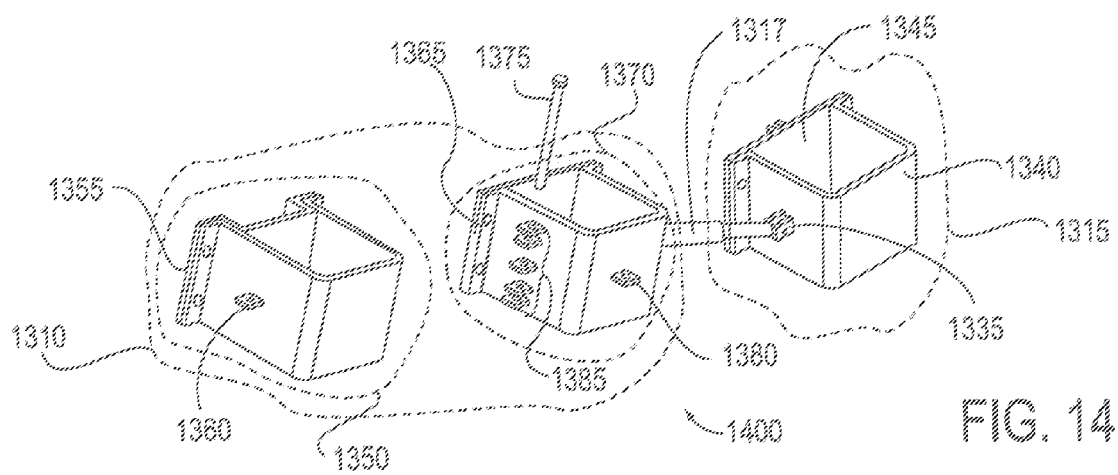
FIG. 14 is an isometric/exploded view of another embodiment of the bracing of the invention.

FIG. 14 is an isometric/exploded view of another embodiment of the bracing of the invention. In this figure and in FIGS. 15-17, the elements of the brace assembly 1301 (FIG. 11A) are described in more detail. First and second brace clamps 1310 in one embodiment is comprised of first brace clamp 1350 removable attached to second brace clamp 1370. The attachment in one embodiment is via attachment flanges 1385 on second brace clamp 1370 and mating flanges (not shown) on first brace clamp 1350. Bolt/pin 1375 passes through eyes in the attachment flanges to join them together. Other methods of removable attachment may be used. First brace clamp comprises two elements; i.e., first U-shaped body 1360 and shallow indented cover plate 1355. Second brace clamp comprises two elements, i.e., second U-shaped body 1380 and flat cover plate 1365. For each brace clamp the U-shaped body removably attaches to the respective cover plate, thus attaching to channel support beams first and second sections 314 and 317.

Third brace clamp 1315 comprises two elements, i.e., third U-shaped body 1340 and flat cover plate 1345. U-shaped body 1340 removably attaches to the flat cover plate 1345, thus attaching to support column 318. Third brace clamp 1315 removably attaches to second brace clamp 1370 via shock absorber 1317 or other strut, rod, or other suitable means. Shock absorber 1317 removably attaches to third brace clamp 1315 via flange 1335 and a corresponding flange (not shown) on second brace clamp 1370.

FIGS. 15, 16, and 17 are isometric/exploded views of one embodiment a portion of the bracing assembly 1301. For each of the first, second, and third brace clamps (1350, 1370, and 1315, respectively), the respective U-shaped body attaches via bolts through holes (e.g., 1346 and 1347). Other attachment mechanisms may be used.

FIG. 18 is a top/exploded view of another embodiment of a bracing element of a portion of the bracing assembly 1301 (FIG. 11A). Shock absorber 1317 is comprised of a first strut portion 1810, second strut portion 1805 and connector flanges 1815 and 1817. Other known connection methods may be used either rigid or designed to absorb shock.

Other embodiments of the present invention and its individual components will become readily apparent to those skilled in the art from the foregoing detailed description. As will be realized, the invention is capable of other and different embodiments, and its several details are capable of modifications in various obvious respects, all without departing from the spirit and the scope of the present invention. Accordingly, the drawings and detailed description are to be regarded as illustrative in nature and not as restrictive. It is therefore not intended that the invention be limited except as indicated by the appended claims.

What is claimed is:

1. A solar canopy comprising a foldable solar cell structure, the canopy comprising:
   a plurality of hingably interconnected solar panel arrays each having a plurality of solar panels;
   a solar panel support channel, wherein the solar panel support channel is characterized by a first longitudinal axis;
   a support beam;
   a brace characterized by a second longitudinal axis, wherein the brace abuts the solar panel support channel such that the first longitudinal axis of the solar panel support channel is perpendicular to the second longitudinal axis of the brace, and wherein the brace is displaced away from the support beam; and
   a support column having a top portion connected to a longitudinal center portion of the solar canopy at the support beam, for attaching at a bottom portion to a ground foundation and supporting the unfolded solar canopy;
   wherein
   the plurality of solar panels is attached to top portions of the solar panel support channel and the brace,
   the bottom portion of the solar panel support channel is attached to a top portion of the support beam,
   the support beam comprises a first hinged joint for cooperating in folding into mutual, near coplanar juxtaposition;
   the first hinged joint separates the support beam between a first section and a second section, the first section being characterized by a third longitudinal dimension,
   the first section of the support beam is affixed to the support column by a second hinge at a first end of the third longitudinal dimension;
   the second section folds underneath the first section about the first hinged joint, and
   the first hinged joint is at a second end of the third longitudinal dimension,
   and whereby the solar canopy, when unfolded, is T-shaped viewed on end.

2. The structure of claim 1 wherein the solar panel support channel comprises a C-channel.

* * * * *